(12) United States Patent
Wang et al.

(10) Patent No.: US 6,486,593 B1
(45) Date of Patent: Nov. 26, 2002

(54) PLASMA ACCELERATOR

(75) Inventors: Zhehui Wang, Los Alamos, NM (US); Cris W. Barnes, Santa Fe, NM (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 229 days.

(21) Appl. No.: 09/672,045

(22) Filed: Sep. 29, 2000

(51) Int. Cl.⁷ .............................................. H01J 17/26
(52) U.S. Cl. ................... 313/231.31; 313/295
(58) Field of Search ................ 313/231.31, 231.01, 313/231.41, 295, 362.1; 315/111.21, 111.61, 111.71, 111.91

(56) References Cited

U.S. PATENT DOCUMENTS

| | | | |
|---|---|---|---|
| 3,579,028 A | * 5/1971 | Paine et al. ............ | 315/111 |
| 4,010,396 A | 3/1977 | Ress et al. ............. | 313/231.3 |
| 4,370,176 A | 1/1983 | Bruel .................... | 148/1.5 |
| 4,913,030 A | 4/1990 | Reynolds ............... | 89/8 |
| 5,291,734 A | 3/1994 | Sohnly .................. | 60/202 |
| 5,352,954 A | * 10/1994 | Cirri .................... | 315/111.21 |
| 34,806 A | 12/1994 | Cann .................... | 427/446 |
| 5,389,195 A | 2/1995 | Ouderkirk et al. ....... | 156/643 |
| 5,435,900 A | 7/1995 | Gorokhovsky ......... | 204/298.41 |
| 5,439,191 A | 8/1995 | Nichols et al. .......... | 244/169 |
| 5,581,155 A | 12/1996 | Morozov et al. ........ | 315/111.21 |
| 5,750,205 A | 5/1998 | Shashkovsky et al. ... | 427/535 |
| 5,751,113 A | 5/1998 | Yashnov et al. ......... | 315/111.21 |
| 5,773,787 A | 6/1998 | Turchi .................. | 219/121.48 |
| 5,798,602 A | 8/1998 | Gopanchuk et al. ..... | 313/359.1 |
| 5,845,880 A | 12/1998 | Petrosov et al. ........ | 244/169 |
| 5,847,493 A | 12/1998 | Yashnov et al. ......... | 315/231.31 |
| 5,869,428 A | 1/1999 | Fruchtman .............. | 250/251 |
| 5,892,329 A | 4/1999 | Arkhipov et al. ....... | 315/111.11 |
| 6,150,764 A | * 11/2000 | Hruby et al. ........... | 315/111.61 |

* cited by examiner

Primary Examiner—Robert H. Kim
Assistant Examiner—Jurie Yun
(74) Attorney, Agent, or Firm—G. Morrison Bennett; Paul A. Gottlieb

(57) ABSTRACT

There has been invented an apparatus for acceleration of a plasma having coaxially positioned, constant diameter, cylindrical electrodes which are modified to converge (for a positive polarity inner electrode and a negatively charged outer electrode) at the plasma output end of the annulus between the electrodes to achieve improved particle flux per unit of power.

30 Claims, 3 Drawing Sheets

PLASMA ACCELERATOR

This invention was made with government support under Contract No. W-7405-ENG-36 awarded by the U.S. Department of Energy. The government has certain rights in the invention.

TECHNICAL FIELD

This invention relates to plasma acceleration.

BACKGROUND ART

Various plasma accelerators that take advantage of the Hall effect have been disclosed in U.S. Patents including, for example, U.S. Pat. No. 5,847,493 (Yashnov et al., Dec. 8, 1998), and U.S. Pat. No. 5,751,113 (Yashnov et al., May 12, 1998), and U.S. Pat. No. 5,845,880 (Petrosov et al., Dec. 8, 1998), with different distributions of the magnetic field.

Other configurations for plasma acceleration devices have been disclosed in a number of U.S. Patents such as U.S. Pat. No. 4,010,396 (Ress and Nolde, Mar. 1, 1977), U.S. Pat. No. 4,913,030 (Reynolds, Apr. 3, 1990); U.S. Pat. No. 5,291,734 (Sohnly, Mar. 8, 1994); U.S. Pat. No. 5,892,329 (Arkhipov, Apr. 6, 1999); U.S. Pat. No. 5,581,155 (Morozov et al., Dec. 3, 1996); U.S. Pat. No. 5,869,428 (Fruchtman, Jan. 12, 1999); U.S. Pat. No. 5,798,602 (Gopanchuk and Sorokin, Aug. 25, 1998); U.S. Pat. No. 5,435,900 (Gorokhovsky, Jul. 25, 1995); U.S. Pat. No. 5,389,195 (Ouderkirk et al., Feb. 14, 1995); U.S. Pat. No. Re. 34,806 (Cann, Dec. 13, 1994); and U.S. Pat. No. 4,370,176 (Bruel, Jan. 25, 1983) which disclose various positions and directions for the magnetic fields and electrical fields, channel configurations, inductor arrangements, and vacuum insulator/isolator structures.

U.S. Pat. No. 5,750,205 (Shashkovsky et al., May 12, 1998) discloses an erosion type coaxial plasma accelerator for application of surface treatments on metallic substrates. U.S. Pat. No. 5,773,787 (Turchi, Jun. 30, 1998) discloses use of a pulsed plasma flow to displace magnetic flux, thereby inducing high voltages across multi-turn coils placed near the end of a coaxial gun.

However, there is still a need for plasma accelerators with higher particle flux per unit of power and which are more efficient while using electrical potentials to achieve a steady-state or pulsed acceleration of the plasma.

Therefore, it is an object of this invention to provide a plasma accelerator and a method of accelerating plasma particles.

It is another object of this invention to provide a plasma accelerator with higher particle flux per unit of power.

It is a further object of this invention to provide a plasma accelerator which allows axial acceleration of plasma mass by different electrical potentials.

It is yet another object of this invention to provide a plasma accelerator which can provide steady-state or pulsed acceleration of a plasma.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DISCLOSURE OF INVENTION

To achieve the foregoing and other objects, and in accordance with the purposes of the present invention, as embodied and broadly described herein, there has been invented an apparatus for acceleration of a plasma having coaxially disposed cylindrical electrodes which have output end or nose additions of mesh screen shaped to converge (for a positive polarity inner electrode) or diverge (for a negative polarity inner electrode) to achieve improved particle flux per unit of power.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

BEST MODES FOR CARRYING OUT THE INVENTION

When electrostatically accelerating a plasma, the charge separation between ions and electrons along the flow direction can be balanced by the Hall effect wherein a transverse electric field is developed in each of the electrodes, thereby achieving high particle flux in the tens of eV up to keV particle energy range, limited only by the power supply and the cooling technologies. It has been discovered that the normal space charge limitation on particle flux can be exceeded by balancing the charge separation between ions and electrons along the flow direction. To accomplish this, coaxially positioned, constant diameter, cylindrical electrodes are modified to converge (for a positive polarity inner electrode and a negatively charged outer electrode) at the plasma output end of the annulus between the electrodes. The convergence of the electrodes causes the axial streamlines of the mass flow to intersect the different potentials between the inside and the outside electrodes and to be subjected to an electrostatic force which accelerates the mass flow.

In an alternative embodiment, the coaxially positioned cylindrical electrodes are modified to diverge at the plasma output end of the cylindrical plasma accelerator. In this alternative embodiment, with a negative polarity inner electrode and a positively charged outer electrode, the diverging portion of the inner electrode is an open mesh screen at the output end.

Each of the embodiments of the invention can be considered as operating in three stages in three sections of the apparatus: an input or ionization stage in a first section, a drift stage in a second section, and an acceleration stage in a third section.

Figure 1:
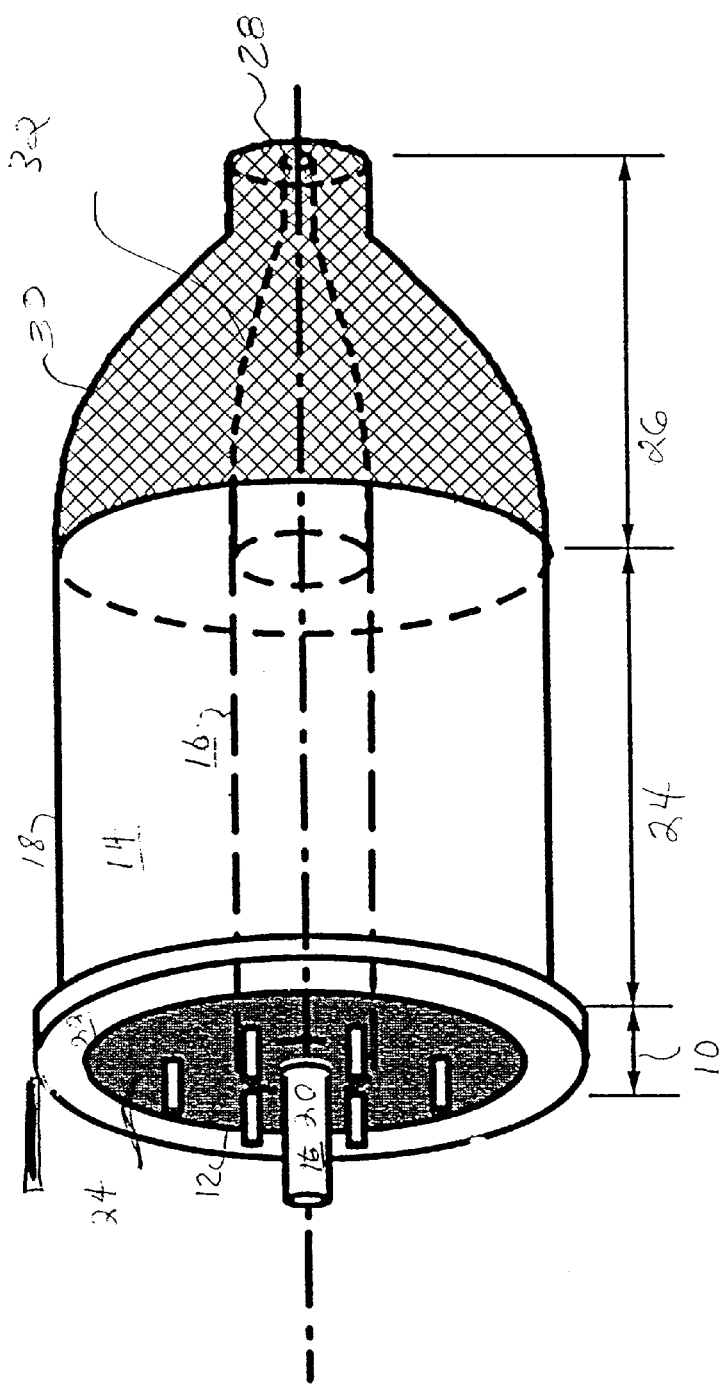
FIG. 1 is a schematic of an invention apparatus with a converging output end configuration.

In the first embodiment of the invention, as shown in the schematic of FIG. 1, converging screens direct the plasma acceleration during the acceleration stage of the three-stage device.

During the input or ionization stage in the upstream first section 10 of the plasma acceleration device, plasma gas is introduced through a suitable number of input ports 12 into an anulus 14 in the upstream section 10 between a positively charged inner electrode 16 and a negitively charged outer electrode 18 in any suitable manner, such as with the use of puff valves. The electrical connections to the electrodes are made between an electrical feed 20 on the inside electrode 16 and an electrical feed 22 on the outside electrode 18, separated by an insulator 24.

The insulator is made of a material that can provide electrical insulation between the inner and outer electrodes, that can withstand high temperatures up to 1000° C. or more, and that has sufficient mechanical strength to hold the structure, including gas input ports 12, inner electrode feed 20 and the outer electrode feed 24, together. It is also advantageous to use materials which can tolerate high vacuum environments so that they can be tested and used in a typical laboratory setting. Presently preferred materials for the insulator ring are non-conducting materials such as ceramics, boron nitride, and alumina.

The insulator 24 is positioned to provide electrical insulation between the coaxially arranged, positively charged inner electrode electrical feed 20 and the negatively charged, outer electrode electrical feed 22.

A power supply of any suitable type is connected to the inner electrode electrical feed 20 and the outer electrode electrical feed 22 in any suitable manner. Generally a direct current power source is presently preferred. A typical voltage required of the direct current power supply is in the range of tens of volts up to thousands of volts (kV). The electric current and the total electric power are proportionally determined.

The amount of power required for either embodiment of the invention depends upon the dimensions of the plasma accelerator, the operating voltage of the plasma acclerator, and the type of gas used to form the plasma. This relationship may be summarized as follows:

$$P = 2V_b^2 / [\mu_0 \ln(r_0/r_i) U_c]$$

where

P=total accelerator power $V_b$=DC applied voltage across the inner and outer electrodes $\mu_0 = 4\pi \times 10^{-7}$ H·m$^{-1}$=permeability of the vacuum $r_0$=constant outer electrode radius in second section $r_i$=constant inner electrode radius in second section $U_C = (2E_i/M)^{1/2}$, where $E_i$ is ionization energy for the plasma gas atom and M is mass of the plasma gas atom.

A rectified radio frequency type power source can also be effectively used to improve the ionization of the plasma gas in the first stage. For example, an economical, standard 13.2 MHz radio frequency can be applied across the electrodes after being rectified. Whenever RF power sources are lighter in weight than DC power sources, RF power sources are useful when the invention plasma accelerators are to be used as thrusters for spacecraft propulsion or whenever it is important to minimize weight of equipment.

A plasma gas is introduced into the first section 10 from the gas input ports 12. This can be done by connecting ports 12 to puff valves, with puff vlaves connected to gas reservoirs, or by any other suitable means.

Any of the plasma gases known in the art, such as helium, argon, xenon, hydrogen, nitrogen, or mixtures or isotopes thereof, can be used for forming the plasma. Vaporized metallic species such as lithium or sodium can also be used for plasma formation.

The plasma gas is partially ionized in the first input stage, either by electrical breakdown effects or by active ionization by such techniques as radio-frequency fields, depending upon what type of power source is used.

The inner electrode 16 extends through the second section 24 of the accelerator where the second drift stage occurs.

During the drift stage in the second section 24 downstream of the first section 10, constant-velocity ion and electron drift takes place in the annulus 14 between the cylindrical electrodes. Both the inner electrode 16 and the outer electrode 18 have constant radii, are coaxially positioned and are equidistant all along their length in the second section 24. No acceleration in excess of the constant-velocity drift takes place in the second section 24.

At the end of the second section 24 the outer electrode 18 is attached to a frustoconic or similarly shaped section of open mesh screen 30 of conducting material which extends through the third section 26 of the plasma accelerator. The open mesh screen 30 forms an equipotential surface that defines a boundary for accelerating plasma ions toward the open mesh screen 30.

In a like manner, a frustoconic or simililarly shaped section of a tube of solid conducting material is attached to the end of the second section portion of the inner electrode 16 to serve as a continuation of the inner electrode 32 through the third section 26 of the plasma accelerator. Alternatively, the inner electrode 16 may simply be continued, albeit reshaped, through the third section 26 of the plasma accelerator.

The inner and outer electrodes are coaxially positioned in the third section 26 but the open mesh screen outer electrode 30 converges toward the third section inner electrode 32. The convergence is not so close, however, as to fail to maintain sufficient electrical separation of the electrodes to maintain a steady-state current flow between the electrodes.

The outer electrode screen 30, in conjunction with the curved electrode shape of the third section inner electrode 32, provides an acceleration field for the plasma. The inner and outer electrodes are continuous and each operates at its own potential, with no need for segmenting the electrodes into different potential rings.

The plasma flows from the second section 24 into the third section 26 where acceleration of the plasma occurs. Between the electrodes in the third section of the plasma accelerator the electrical field is both radial (to drive the radial current density) and axial (to accelerate the plasma). The curved electrodes (each at a constant fixed electric potential) allow the electric field between the electrodes to have both radial and axial components. In the third section 26, the current density is purely radial and the accelerated mass flow is purely axial. The Hall effect force in the axial direction due to the radial current density interacting with the azimuthal magnetic field causes axial charge separation of the electrons and ions. This axial force can then balance the applied electric field in that axial direction. The applied electric field would normally be causing charge separation and reducing the ability of the electric field to accelerate the plasma. However, in the present invention, the plasma accelerator uses the Hall effect to balance the charge separation and allows the electric field to accelerate the entire plasma without limitations of space charge.

During the acceleration stage the plasma ions are accelerated up to the maximum energy that is equivalent to the applied voltage between the electrodes. The open mesh screen 30 of the outer electrode 18 in the third section 26 of the plasma accelerator allows a large fraction of the accelerated ions to pass through the screen 30 and out of the system. The momentum of the ions exiting the third section 26 of the plasma accelerator generate thrust in the direction opposite that of the ion flow outward from the plasma accelerator. The ions also carry directed energy which is useful for materials processing or surface treatment or modification applications.

Figure 2:
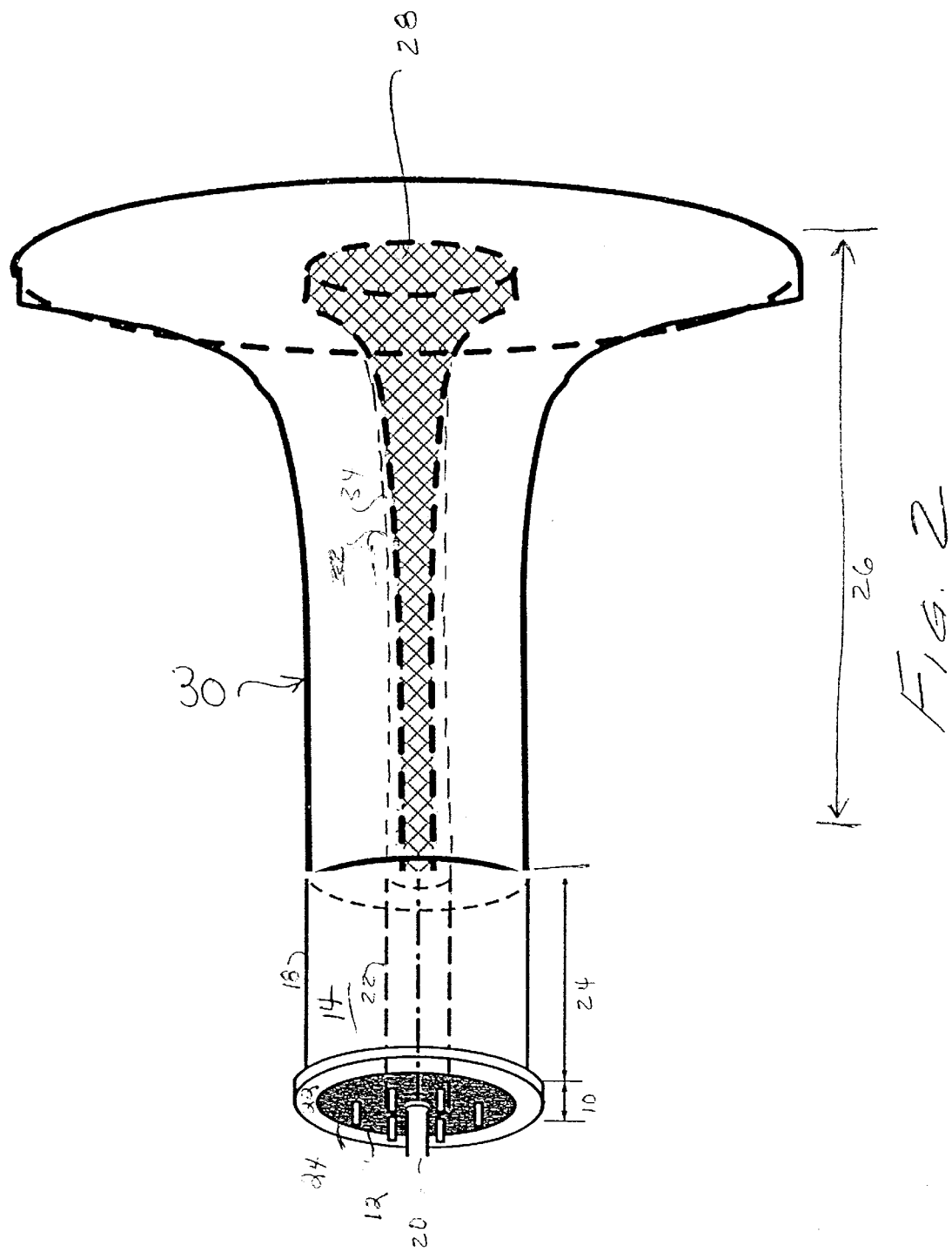
FIG. 2 is a schematic of an invention apparatus with a diverging output end configuration.

In an alternative embodiment of the invention, as shown in the schematic of FIG. 2, the first two sections 10, 24 of the plasma accelerator are similar to those of the embodiment shown in FIG. 1 and described above. However, the output end of the inner electrode 34 in the third section 26 of the embodiment shown in FIG. 2 is an open mesh screen that diverges concentrically and radially from the axis of the electrodes. The portion of the outer electrode 30 in the third section 26 of this embodiment of the invention is a continuation of the outer electrode 18 in the second section 24 of the plasma accelerator and can be made of the same conductive material, but it is also outwardly flanged such that it diverges concentrically and radially from the axis of the electrodes. A large fraction of the accelerated ions from the annulus 14 between the coaxially arranged, constant radii, cylindrical electrodes 18 and 22 in the second section 24 passes out of the annulus 14 through the outwardly flanged open mesh screen of the inner electrode 34 in the third section 26 of the plasma accelerator.

Each of the electrodes in either embodiment of the invention can be made of any sufficiently electrically conductive material such as copper, tungsten, tungsten coated copper, silver, aluminum, stainless steel, or mixtures or alloys thereof. Oxygen-free copper is presently preferred because of its high electrical and thermal conductivity, high refractivity, modestly low sputtering coefficient, and ease with which it can be machined or fabricated. Both of the electrodes can be made of the same or different material.

The outer electrode is preferably made of a tube of solid material in the first two sections of the accelerator. The portion of the outer electrode extending through the third section is an open screen mesh in the first embodiment of the invention.

The inner electrode can be either a solid rod or a hollow tube if preferred to reduce the weight of the plasma accelerator. The presently preferred material for the open mesh screen of the third section of the inner electrode of the second embodiment of the invention is tungsten or tungsten coated copper.

The plasma accelerators of the invention can be any of a wide range of sizes. The ion gyroradius must be less than or at most equal the coaxial gap annulus size so that the ions become magnetized. Therefore, the plasma accelerators must be at least about a fraction of one millimeter radially and axially in size. The plasma accelerators of the invention must be small enough so that the power density as a ratio of the volume to the input power of the second section drift channel does not become too high to keep the plasma from being ionized. Generally, the plasma should be more than 1 eV electron temperature. Therefore, the plasma accelerators cannot be longer than about a few hundred meters in size.

Generally, plasma accelerators from about 10 cm to a few meters radially and axially are useful for most applications.

Plasma accelerators which use from about 100 kW to about 500 MW are generally most useful for industrial and thruster applications.

In both embodiments of the invention, the total electrical current of the system is proportional to the applied voltage. This relationship can be described by the formula:

$$I = 2 V_b / [\mu_o \ln(r_o/r_i) U_c]$$

where
I = total current applied
$V_b$ = DC voltage applied across the inner and outer electrodes $\mu_o$ $4\pi \times 10^{-7}$ H·m$^{-1}$ = permeability of the vacuum
$r_o$ = constant radius of the outer electrode in the second section
$r_i$ = constant radius of the inner electrode in the second section
$U_c$ = Alfven critical ionization velocity = $(2E_i/M)^{1/2}$
where
$E_i$ = ionization energy for the gas atom,
M = mass of the gas atom
For example,
$E_i$ is 13.6 eV for the hydrogen atom and
M is $1.67 \times 10^{-27}$ kg for hydrogen.
Therefore, $U_c$ is 51 km/sec for hydrogen gas.

Voltage in the range from about 10 volts to about 10,000 volts is generally useful in the plasma accelerators of this invention. With the advance of power supply and cooling technologies, voltages beyond this range are possible. As the voltage is varied for the two selected values for a given set of electrode shapes, the current density profile adjusts and the total system current changes proportionally. For example, if the voltage is varied between 0.1 and 1 keV, then the current will be in the range from about 20 kA to about 200 kA and the total power will be in the range from about 2 MW to about 200 MW for a set of electrodes with constant inner electrode radius of 17 cm and an outer radius of 35 cm in the drift section.

The magnetic field is generated by the current flowing in the inner electrode. The magnetic field lines are concentric circles with their centers on the symmetric axis of the coaxially positioned electrodes. The direction of the magnetic field depends solely upon the direction of the electric current flowing in the inner electrode according to the right-hand rule.

The maximum energy of acceleration is given by the drop of the applied voltage along a streamline over the distance from the end of the second (drift) section to the downstream end of the third (acceleration) section where the streamlines cross the mesh screen. The ion flow is in an annular ring defined by the initial inner and outer radii of the upstream coaxial drift section, with a radially varying exit energy depending on the voltage drop along each streamline up to the maximum energy, which is equal to the sum of total applied voltage between the inner and outer electrodes and the ionization energy for the plasma gas.

In the first embodiment of the invention with converging electrodes at the exit end of the accelerator, particles initially near the outer electrode see little total potential drop and have only the initial drift energy as they exit the mesh. Particles initially near the inner electrode see the full potential drop between the electrodes and exit the mesh with energy equal to the voltage plus the minimal drift energy.

Figure 3:
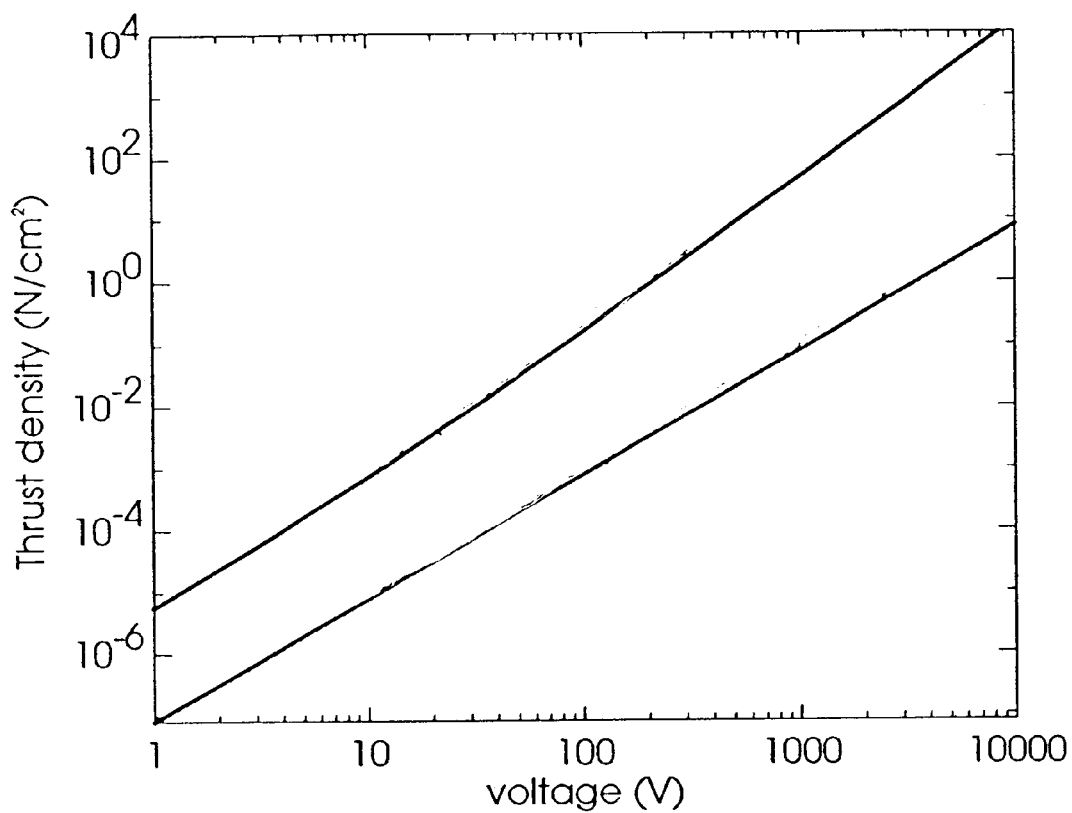
FIG. 3 is a graph comparing the ratio of thrust density to voltage in operation of the invention plasma accelerator with the ratio of thrust density to voltage in conventional Child-Langmuir ion thrusters.

The particle flux scales as the voltage squared as long as the plasma gas in the first ionization stage is less than fully ionized, because the electrical energy (proportional to the voltage squared) goes into more and more ionization. For spacecraft propulsion and material deposition applications, the particle flux and, correspondingly, the thrust, is an important parameter. The total thrust generated compares advantageously with the total thrust generated in conventional Child-Langmuir ion thrusters and can be stated:

$$T = PMV_e/(3\beta E_i)$$

where
T = particle flux at exit of the plasma accelerator
P = electrical power driving the accelerator
M = plasma gas particle mass $V_e$=exhaust particle velocity
$\beta$=~5
$E_i$=ionization energy of the plasma gas This relationship is shown in the top line in the graph of FIG. 3 which shows the relationship of thrust density to voltage in operation of the invention plasma accelerators compared with the bottom line showing the relationship of thrust density to voltage in operation of the conventional Child-Langmuir ion thrusters.

Conversely, in the second embodiment of the invention with diverging electrodes at the exit end of the accelerator, particles initially near the inner electrode see little total potential drop and have only the initial drift energy as they exit the mesh. And, analogously, particles initially near the outer electrode see the full potential drop between the electrodes and exit the mesh with energy equal to the voltage plus the minimal drift energy.

The following examples of calculated embodiments of the invention will demonstrate the operability of the invention.

EXAMPLE I

A plasma accelerator in accordance with the invention has inner and outer electrodes made of copper and an insulator made of boron nitride. The converging open mesh portion of the outer electrode is made of tungsten coated copper. Thirty-six 0.4 cm diameter plasma gas input ports are evenly spaced about a radius of 16 cm. An inner electrode electrical feed with a 12 cm radius is connected to an inner electrode which also has a radius of 12 cm. An outer electrode with a radius of 24 cm provides for an annular width of 12 cm. The outer electrode tube wall is between 4 and 5 cm thick. The inner electrode is a solid piece of copper.

The first (ionization) section of the plasma accelerator is from about 1 cm to about 2 cm in length.

The second (drift) section of the plasma accelerator is from 15 to 30 cm in length. The third (acceleration) section of the plasma accelerator is from about 10 to 20 cm in length. The mesh is about 1.0 cm thick with openings in the mesh about 5 cm across.

Scientific-research-grade argon is used as the plasma gas. It is supplied to the input ports through gas-tight tubing. The argon flows continuously for steady-state operation. The flow rate is us to a few times $10^{25}$ argon atoms per second, sufficient to maintain a constant argon plasma flux exit from the output end of the plasma accelerator.

Electrical input of 102±30 kA of DC current and 120±36 V is applied across the inner and outer electrode electrical field. A variation in electrical current correspond to a linear variation in voltage difference between the inner and outer electrodes.

The particle flux is as high as $5 \times 10^{23}$ argon atoms per second. The corresponding particle thrust is as high as 64 N.

This type of plasma accelerator is useful for surface treatment and modification in the microelectronics industry.

EXAMPLE II

Another plasma accelerator has inner and outer electrodes of copper, a converging outer electrode mesh of tungsten coated copper, and a ceramic insulator between the electrodes. Eighteen gas input ports with 0.3 cm diameters are distributed at a 5 cm radius in the insulator. Hydrogen is used as the plasma gas.

The inner electrode electrical feed has a 3 cm radius and the inner electrode has a radius of 2.2 cm. The outer electrode has a radius of 22 cm, thus providing a 19.8 cm annulus. The outer electrode has a thickness between 0.2 to 0.3 cm. The inner electrode is a solid piece of copper rod.

The first section is about 1 cm in length, the second section is about 30 cm in length and the third section is about 20 cm in length. The mesh portion of the outer electrode is about 0.5 cm thick with an exit end opening about 5 cm in diameter. The inner electrode has an exit end opening about 1 cm in diameter.

Electrical input of 3.3±0.7 kA of DC current and 112±25 V are applied between the inner and outer electrodes. The outer electrode is grounded. The particle flux from the plasma accelerator of this example is as high as $1.5 \times 10^{22}$ hydrogen atoms per second. The corresponding particle thrust is as high as 1.4 N.

This type of plasma accelerator is useful for high power interplanetary space travel.

EXAMPLE III

Deuterium is used as the plasma gas in a third example of the invention. Both the inner and outer electrodes are made of copper, the insulator is made of boron nitride, and the mesh screen at the end of the converging outer electrode is made of tungsten coated copper.

Fifty 0.5 cm diameter gas input ports are evenly distributed at a radius of 20 cm from the axis of the coaxially arranged electrodes. An inner electrode electrical feed has a radius of 17.5 cm and the inner electrode continues through the second section with a radius of 17.5 cm. The outer electrode has a radius of 35 cm, providing for a 17.5 cm annulus. Each of the electrodes has a thickness between 1 and 2 cm in the second section and the mesh of the outer electrode has a thickness of 2 cm.

The second section is about 45 cm in length and the third section is about 30 cm in length. The exit end opening in the outer electrode mesh is about 15 cm in diameter. The exit end opening in the inner electrode is about 5 cm in diameter.

Electrical input of 210±10 kA of DC current and 1.1 kV are applied to the inner electrode electrical feed. The particle flux is as high as $1.6 \times 10^{25}$ deuterons per second. Such an intensity deuteron beam is useful for fusion experiments and other plasma devices.

While the apparatuses and methods of this invention have been described in detail for the purpose of illustration, the inventive apparatuses and methods are not to be construed as limited thereby. The claims of this patent are intended to cover all changes and modifications within the spirit and scope thereof.

INDUSTRIAL APPLICABILITY

The apparatus can be used for: materials processing involving thermal loads, including surface modification and treatment, welding, processing of recycled materials, waste processing and treatment; material deposition on surfaces, including applications in the microelectronics industry; generating large thrust for space propulsion applications; producing high intensity keV energy ion and neutral beams; as a beam probe for diagnoses of fusion and other plasma devices.

What is claimed is:

1. An apparatus for plasma acceleration comprising:
   (a) an outer cylindrical electrode;
   (b) an inner cylindrical electrode positioned coaxially within said outer cylindrical electrode;
   (c) a power source connected to supply power to said inner electrode;

(d) a plasma gas source for introducing plasma gas into an annulus between said coaxially positioned cylindrical electrodes;

wherein said outer cylindrical electrode has a mesh screen extension on the output end of said outer cylindrical electrode with said mesh screen extension shaped to converge toward the output end of said inner cylindrical electrode.

2. The apparatus recited in claim 1 wherein said inner electrode is connected to said power source so as to be an anode and said outer electrode is grounded to be a cathode.

3. The apparatus recited in claim 1 wherein the electrical connections between said power source and said inner electrode and said outer electrode are electrical feeds through an insulator separating said inner electrode and said outer electrode.

4. The apparatus recited in claim 1 wherein said power source supplies direct current.

5. The apparatus recited in claim 1 wherein said power source supplies a rectified radio frequency.

6. The apparatus recited in claim 1 wherein said mesh screen extension is frustoconic.

7. The apparatus recited in claim 1 wherein said apparatus is from about one millimeter to about 500 meters in length.

8. The apparatus recited in claim 1 wherein said inner electrode and said outer electrode are each made from a material selected from the group of: copper, tungsten, tungsten coated copper, silver, aluminum, stainless steel, or mixtures or alloys thereof.

9. The apparatus recited in claim 1 wherein said inner electrode and said outer electrode are made from the same material.

10. The apparatus recited in claim 1 wherein said inner electrode and said outer electrode are not made from the same material.

11. The apparatus recited in claim 1 wherein said inner electrode is a hollow tube.

12. The apparatus recited in claim 1 wherein said inner electrode is a solid rod.

13. The apparatus recited in claim 3 wherein said inner electrode is a tube about 4 cm thick with a radius of 12 cm made of copper;

said outer electrode is a tube about 4 cm thick with a 24 cm radius made of copper;

said mesh screen extension of said outer electrode is made of about 1 cm thick tungsten-coated copper mesh with 5 cm openings;

said electrodes are connected to a DC electrical power source; and said insulator is made of boron nitride and has therein 36 plasma gas input ports.

14. The apparatus recited in claim 3 wherein said inner electrode is a solid rod made of copper with a radius of about 2.2 cm;

said outer electrode is a tube about 2 cm thick with a 22 cm radius made of copper;

said mesh screen extension of said outer electrode is made of about 1 cm thick tungsten-coated copper mesh with 5 cm openings;

said electrodes are connected to a DC electrical power source; and said insulator is made of boron nitride and has therein 18 plasma gas input ports.

15. A method for plasma acceleration comprising:

(a) creating a plasma by contacting a plasma gas with an electrical charge in a first end of an annulus between an inner electrode and an outer electrode;

(b) allowing said plasma to stream through said annulus toward a second end of said annulus; and (c) allowing said plasma to stream through a mesh screen at said second end of said annulus.

16. The method of claim 15 wherein said inner electrode is a cylindrical electrode positioned coaxially within said outer electrode which is also a cylindrical electrode.

17. The method recited in claim 15 wherein said outer electrode is connected to said power source so as to be an anode and said inner electrode is grounded to be a cathode.

18. The method recited in claim 15 wherein said inner electrode is connected to said power source so as to be an anode and said outer electrode is grounded to be a cathode.

19. The method recited in claim 15 wherein the electrical connections between said power source and said inner electrode and said outer electrode are electrical feeds through an insulator separating said inner electrode and said outer electrode.

20. The method recited in claim 15 wherein said power source supplies direct current.

21. The method recited in claim 15 wherein said power source supplies a rectified radio frequency.

22. The method recited in claim 16 wherein said outer cylindrical electrode and said inner cylindrical electrode have output ends which diverge outwardly from the longitudinal axis of said inner cylindrical electrode and said outer cylindrical electrode; and wherein the diverging end portion of said inner cylindrical electrode is comprised of a mesh screen.

23. The method recited in claim 16 wherein said outer cylindrical electrode and said inner cylindrical electrode have output ends which converge and wherein the converging end portion of said outer cylindrical electrode is comprised of a mesh screen.

24. The method recited in claim 23 wherein said mesh screen is frustoconic.

25. The method recited in claim 15 wherein said annulus is from about one millimeter to about 500 meters in length.

26. The method recited in claim 15 wherein said inner electrode and said outer electrode are each made from a material selected from the group of: copper, tungsten, tungsten coated copper, silver, aluminum, stainless steel, or mixtures or alloys thereof.

27. The method recited in claim 15 wherein said inner electrode and said outer electrode are made from the same material.

28. The apparatus recited in claim 15 wherein said inner electrode and said outer electrode are not made from the same material.

29. The apparatus recited in claim 15 wherein said inner electrode is a hollow tube.

30. The apparatus recited in claim 15 wherein said inner electrode is a solid rod.

* * * * *